(12) United States Patent
Lee et al.

(10) Patent No.: US 8,303,719 B2
(45) Date of Patent: Nov. 6, 2012

(54) DEPOSIT REMOVING METHOD AND SUBSTRATE PROCESSING METHOD

(75) Inventors: Sungtae Lee, Nirasaki (JP); Yusuke Nakagawa, Nirasaki (JP); Jun Yashiro, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 119 days.

(21) Appl. No.: 12/389,057

(22) Filed: Feb. 19, 2009

(65) Prior Publication Data

US 2009/0205678 A1 Aug. 20, 2009

Related U.S. Application Data

(60) Provisional application No. 61/048,393, filed on Apr. 28, 2008.

(30) Foreign Application Priority Data

Feb. 20, 2008 (JP) .................................. 2008-039358

(51) Int. Cl.
*B08B 9/08* (2006.01)
*B08B 5/00* (2006.01)
(52) U.S. Cl. ........... 134/1.1; 134/22.1; 438/905; 216/67
(58) Field of Classification Search .................. 134/1.1, 134/1.2, 1.3, 22.1, 22.19; 216/67
See application file for complete search history.

(56) References Cited

U.S. PATENT DOCUMENTS

| 5,681,424 | A | 10/1997 | Saito et al. | |
|---|---|---|---|---|
| 6,090,718 | A * | 7/2000 | Soga et al. | 438/714 |
| 2001/0046781 | A1* | 11/2001 | Nakagawa | 438/725 |
| 2003/0056388 | A1* | 3/2003 | Ohno et al. | 34/72 |
| 2006/0027249 | A1* | 2/2006 | Johnson et al. | 134/1.1 |
| 2006/0191555 | A1* | 8/2006 | Yoshida et al. | 134/1.1 |
| 2007/0187362 | A1* | 8/2007 | Nakagawa et al. | 216/58 |

FOREIGN PATENT DOCUMENTS

JP 8-279487 10/1996

* cited by examiner

*Primary Examiner* — Michael Kornakov
*Assistant Examiner* — Natasha Campbell
(74) *Attorney, Agent, or Firm* — Oblon, Spivak, McClelland, Maier & Neustadt, L.L.P.

(57) ABSTRACT

A deposit removing method that can reliably remove deposit produced in plasma processing using plasma produced from a process gas containing methane gas and oxygen gas. In a chamber in which an electrode to which radio frequency electrical power is supplied is disposed, plasma processing is carried out on a substrate using the plasma produced from the process gas containing methane gas and oxygen gas, and then a cleaning step is carried out in which plasma is produced from a mixed gas containing fluorinated compound gas containing hydrogen in the chamber.

7 Claims, 7 Drawing Sheets

DEPOSIT REMOVING METHOD AND SUBSTRATE PROCESSING METHOD

BACKGROUND OF THE INVENTION

1. Field of the Invention

The present invention relates to a deposit removing method and a substrate processing method, and in particular relates to a deposit removing method in which deposit resulting from plasma produced from a process gas containing methane gas and nitrogen gas.

2. Description of the Related Art

In general, plasma etching processing in which trenches, holes, and so on are formed in a semiconductor wafer is carried out in an evacuated processing chamber in which a semiconductor wafer is accommodated. In the processing chamber, a mounting stage on which the semiconductor wafer is mounted, and a showerhead that supplies a process gas into the processing chamber are disposed. The mounting stage is connected to a radio frequency power source and acts as an electrode that applies radio frequency voltage to the interior of the processing chamber. The mounting stage produces an electric field in the processing chamber, and the process gas is turned into plasma by the electric field.

If the plasma etching processing is carried out on the semiconductor wafer using plasma produced from a certain type of process gas, reaction product is produced and becomes attached as deposit to component parts in the processing chamber, for example, a showerhead.

If deposit becomes attached to the showerhead, it becomes difficult to stably produce an electric field in the processing chamber, and therefore, plasma cannot be stably produced. As a result, the etch rate for the semiconductor wafer may decrease as the time period for which radio frequency voltage is applied passes as shown in FIG. 7.

As a method of removing such deposit comprised of reaction product, there is known a method in which plasma is produced from a mixed gas containing oxygen gas ($O_2$ gas), and deposit is removed by the plasma (see, for example, Japanese Laid-open Patent Publication (Kokai) No. H08-279487). In particular, there is known that deposit resulting from plasma etching processing using plasma produced from a process gas containing CF-based gas can be efficiently removed by ashing using plasma produced from a mixed gas containing oxygen gas.

In recent years, finer machining has been demanded, and a process gas containing methane ($CH_4$) gas has been holding promise for realizing such machining.

However, the process gas containing methane gas includes nitrogen ($N_2$) gas as well, CN-type reaction product is produced as a result of the plasma etching processing.

The CN-type reaction product becomes very tightly attached to the showerhead and so on, and it is thus difficult to remove the CN-type reaction product. For example, before developing the present invention, the present inventors used plasma produced from a single gas comprised of oxygen gas so as to remove the CN-type reaction product, and ascertained that the CN-type reaction product can be hardly removed even if ashing using the plasma (pressure: 800 mTorr, supplied radio frequency electrical power: 2000 W, oxygen gas flow rate: 1200 sccm, and magnetic flux density: 300 G) is carried out for 30 seconds. The present inventors also ascertained that the CN-type reaction product can be hardly removed even if plasma produced from a mixed gas comprised of oxygen gas with $CF_4$ gas having high sputtering power added thereto is used.

SUMMARY OF THE INVENTION

The present invention provides a deposit removing method and a substrate processing method that can reliably remove deposit produced in plasma processing using plasma produced from a process gas containing methane gas and oxygen gas.

Accordingly, in a first aspect of the present invention, there is provided a deposit removing method comprising a substrate processing step of carrying out plasma processing on a substrate using plasma produced from a process gas containing methane gas and nitrogen gas in a processing chamber in which an electrode to which radio frequency electrical power is supplied is disposed and a cleaning step of producing plasma from a mixed gas containing fluorinated compound gas containing hydrogen in the processing chamber.

According to the first aspect of the present invention, after the plasma processing is carried out on the substrate using plasma produced from the process gas containing methane gas and nitrogen gas, plasma is produced from the mixed gas containing fluorinated compound gas containing hydrogen in the processing chamber. If the plasma processing is carried out on the substrate using the plasma produced from the process gas, CN-type reaction product is produced and becomes attached as CN-type deposit to component parts in the processing chamber, and if the plasma is produced from the mixed gas, H* radicals, F* radicals, and O* radicals as well as $CFx^+$ ions and $O^-$ ions are produced. The H* radicals have high reducing power, and hence the CN-type deposit is not only sputtered by the $CFx^+$ ions and the $O^-$ ions but also reduced into methane ($CH_4$), ammonia ($NH_3$), and so on to sublime. As a result, the CN-type deposit can be reliably removed.

The first aspect of the present invention can provide a deposit removing method, wherein the fluorinated compound gas containing hydrogen is $CHF_3$ gas.

According to the first aspect of the present invention, because the fluorinated compound gas containing hydrogen is $CHF_3$ gas, H* radicals, F* radicals, and O* radicals can be reliably produced if plasma is produced from the mixed gas. As a result, the CN-type deposit can be more reliably removed.

The first aspect of the present invention can provide a deposit removing method, wherein a pressure in the processing chamber in the cleaning step is maintained at 30 mTorr or higher.

According to the first aspect of the present invention, because the pressure in the processing chamber in the cleaning step is maintained at 30 mTorr or higher, excitation of the mixed gas can be more promoted.

The first aspect of the present invention can provide a deposit removing method, wherein in the cleaning step, the mixed gas further includes oxygen gas, and a ratio of the fluorinated compound gas containing hydrogen to the oxygen gas in the mixed gas lies inside a range of 0.5 to 2.0.

According to the first aspect of the present invention, because in the cleaning step, the ratio of the fluorinated compound gas containing hydrogen to the oxygen gas in the mixed gas lies inside a range of 0.5 to 2.0, the number of hydrogen atoms in the mixed gas can be maintained at a predetermined value or more, and as a result, not less than a predetermined amount of H* radicals, F* radicals, and O* radicals can be more reliably produced.

Accordingly, in a second aspect of the present invention, there is provided a substrate processing method comprising a substrate processing step of continuously carrying out plasma processing on a plurality of substrates included in one lot using plasma produced from a process gas containing methane gas and nitrogen gas in a processing chamber in which an electrode to which radio frequency electrical power is supplied is disposed and a cleaning step of, after continuously carrying out the plasma processing on the plurality of substrates included in the one lot, producing plasma from a mixed gas containing fluorinated compound gas containing hydrogen in the processing chamber.

According to the second aspect of the present invention, after the plasma processing is continuously carried on a plurality of substrates included in one lot using plasma produced from the process gas containing methane gas and nitrogen gas, plasma is produced from the mixed gas containing fluorinated compound gas containing hydrogen in the processing chamber, and hence the CN-type deposit deposited on component parts can be reliably removed through the plasma processing on the plurality of substrates included in one lot. As a result, plasma can be stably produced in the processing chamber in a stably manner in the plasma etching processing on wafers included in the next lot, and hence a decrease in the yield of semiconductor devices manufactured from the substrates can be prevented.

The features and advantages of the invention will become more apparent from the following detailed description taken in conjunction with the accompanying drawings.

BRIEF DESCRIPTION OF THE DRAWINGS

FIGS. 2A and 2B are views useful in explaining how deposit is removed in the deposit removing method according to the present embodiment, in which FIG. 2A shows how deposit is removed using H* radicals, F* radicals, and O* radicals, and FIG. 2B shows how deposit is removed using $CFx^+$ ions and $O^-$ ions;

DETAILED DESCRIPTION OF PREFERRED EMBODIMENTS

The present invention will now be described in detail with reference to the drawings showing a preferred embodiment thereof.

Figure 1:
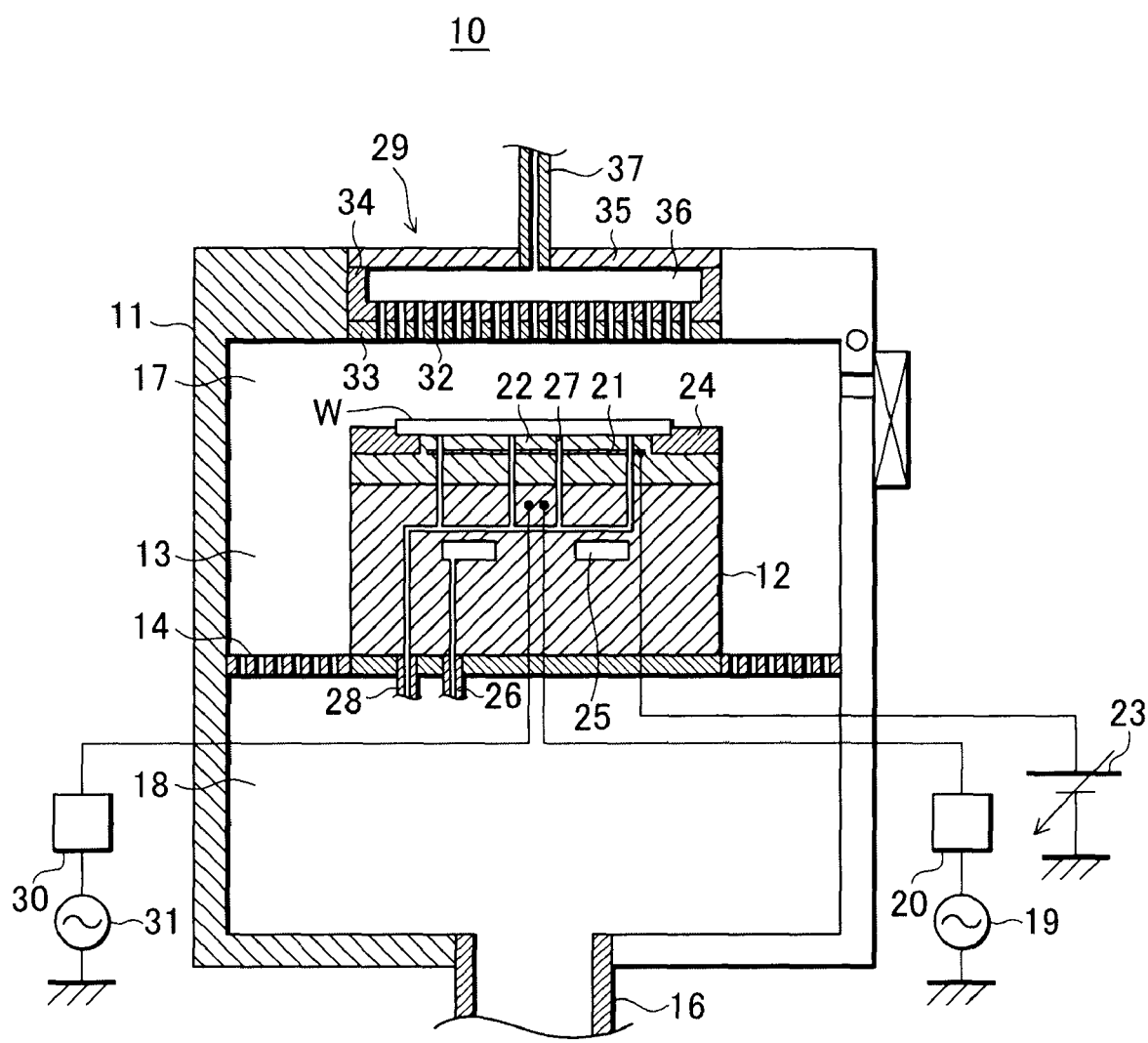
FIG. 1 is a cross-sectional view schematically showing the construction of a substrate processing apparatus that executes a deposit removing method according to an embodiment of the present invention.

FIG. 1 is a cross-sectional view schematically showing the construction of a substrate processing apparatus that executes a deposit removing method according to the present embodiment. The substrate processing apparatus is constructed such as to carry out plasma etching processing on a semiconductor wafer as a substrate.

Referring to FIG. 1, the substrate processing apparatus 10 has a chamber 11 (processing chamber) in which a semiconductor wafer (hereinafter referred to merely as a "wafer") W having a diameter of, for example, 300 mm is accommodated, and a cylindrical susceptor 12 on which the wafer W is mounted is disposed in the chamber 11. Moreover, in the substrate processing apparatus 10, an exhaust flow path 13 that acts as a flow path through which gas above the susceptor 12 is exhausted out of the chamber 11 is formed between the inner wall of the chamber 11 and the side face of the susceptor 12. An exhaust plate 14 is disposed part way along the side exhaust path 13.

The exhaust plate 14 is a plate-shaped member having a large number of holes therein and acts as a partition plate that partitions the chamber 11 into an upper portion and a lower portion. In the upper portion (hereinafter referred to as the "reaction chamber") 17 of the chamber 11 partitioned by the exhaust plate 14, plasma is produced. An exhaust pipe 16 through which gas in the chamber 11 is exhausted is connected to the lower portion (hereinafter referred to as the "exhaust chamber (manifold)") 18 of the chamber 11. The exhaust plate 14 captures or reflects plasma produced in the reaction chamber 17 to prevent leakage of the plasma into the manifold 18.

The exhaust pipe 16 has a TMP (turbo-molecular pump) and a DP (dry pump) (both not shown) connected thereto, and these pumps reduce the pressure in the chamber 11 down to a vacuum state. Specifically, the DP reduces the pressure in the chamber 11 from atmospheric pressure down to an intermediate vacuum state (e.g. a pressure of not more than $1.3 \times 10$ Pa (0.1 Torr)), and the TMP is operated in collaboration with the DP to reduce the pressure in the chamber 11 down to a high vacuum state (e.g. a pressure of not more than $1.3 \times 10^{-3}$ Pa ($1.0 \times 10^{-5}$ Torr)), which is at a lower pressure than the intermediate vacuum state. It should be noted that APC valve (not shown) controls the pressure in the chamber 11.

A first radio frequency power source 19 is connected to the susceptor 12 in the chamber 11 via a first matcher 20, and a second radio frequency power source 31 is connected to the susceptor 12 in the chamber 11 via a second matcher 30. The first radio frequency power source 19 supplies radio frequency electrical power of 3.2 MHz to the susceptor 12, and the second radio frequency power source 31 supplies radio frequency electrical power of 100 MHz to the susceptor 12. The susceptor 12 thus acts as an electrode. The first matcher 20 and the second matcher 30 reduce reflection of the radio frequency electrical power from the susceptor 12 so as to maximize the efficiency of the supply of the radio frequency electrical power into the susceptor 12.

An electrostatic chuck 22 having an electrostatic electrode plate 21 therein is provided in an upper portion of the susceptor 12. The electrostatic chuck 22 is formed by placing an upper disk-shaped member, which has a smaller diameter than a lower disk-shaped member having a certain diameter, over the lower disk-shaped member. It should be noted that the electrostatic chuck 22 is made of ceramic. When a wafer W is mounted 35 on the susceptor 12, the wafer W is disposed on the upper disk-shaped member of the electrostatic chuck 22.

A DC power source 23 is electrically connected to the electrostatic electrode plate 21 of the electrostatic chuck 22. Upon a positive DC voltage being applied to the electrostatic electrode plate 21, a negative potential is produced on a surface of the wafer W which faces the electrostatic chuck 22

(hereinafter referred to as "the rear surface of the wafer W"). A potential difference thus arises between the electrostatic electrode plate 21 and the rear surface of the wafer W, and hence the wafer W is attracted to and held on the upper disk-shaped member of the electrostatic chuck 22 through a Coulomb force or a Johnsen-Rahbek force due to the potential difference.

Moreover, an annular focus ring 24 is mounted on the electrostatic chuck 22 such as to surround the attracted and held wafer W. The focus ring 24 is made of a conductive member such as silicon, and focuses plasma in the reaction chamber 17 toward a front surface of the wafer W, thus improving the efficiency of the plasma etching processing.

An annular coolant chamber 25 that extends, for example, in a circumferential direction of the susceptor 12 is provided inside the susceptor 12. A coolant, for example, cooling water or a Galden (registered trademark) fluid, at a low temperature is circulated through the coolant chamber 25 via a coolant piping 26 from a chiller unit (not shown). The susceptor 12 cooled by the low-temperature coolant cools the wafer W and the focus ring 24 via the electrostatic chuck 22.

A plurality of heat transfer gas supply holes 27 are opened to a portion of the upper surface of the upper disk-shaped member of the electrostatic chuck 22 on which the wafer W is attracted and held (hereinafter referred to as the "attracting surface"). The heat transfer gas supply holes 27 are connected to a heat-transmitting gas supply unit (not shown) via a heat-transmitting gas supply line 28, and the heat-transmitting gas supply unit supplies helium (He) gas as a heat transfer gas into a gap between the attracting surface and the rear surface of the wafer W via the heat transfer gas supply holes 27. The helium gas supplied into the gap between the attracting surface and the rear surface of the wafer W effectively transfers heat from the wafer W to the electrostatic chuck 22.

A showerhead 29 is disposed in a ceiling portion of the chamber 11 such as to face the susceptor 12. The showerhead 29 has a ceiling electrode plate 33 having therein a number of gas holes 32, a cooling plate 34 that detachably suspends the ceiling electrode plate 33, and a lid member 35 that covers the cooling plate 34. Moreover, a buffer chamber 36 is provided inside the cooling plate 34, and a process gas introducing pipe 37 is connected to the buffer chamber 36. The showerhead 29 supplies a process gas supplied to the buffer chamber 36 through the process gas introducing pipe 37 to the interior of the reaction chamber 17 via the gas holes 32.

Operation of the component parts of the above described substrate processing apparatus 10 is controlled in accordance with programs for the plasma etching processing and wafer lot processing, described later, by a CPU of a control unit (not shown) of the substrate processing apparatus 10.

In the substrate processing apparatus 10, first, the wafer W is transferred into the chamber 11 and mounted on the susceptor 12, and then the showerhead 29 supplies a process gas containing methane gas and nitrogen gas (hereinafter referred to as the "methane-containing process gas") to the interior of the reaction chamber 17.

Next, the first radio frequency power source 19 and the second radio frequency power source 31 supply radio frequency electrical power to the susceptor 12 to apply radio frequency voltage to the interior of the reaction chamber 17 so that the methane-containing process gas is turned into plasma in the reaction chamber 17, whereby the wafer W is subjected to the plasma etching processing using the plasma (substrate processing step).

Figure 2A:
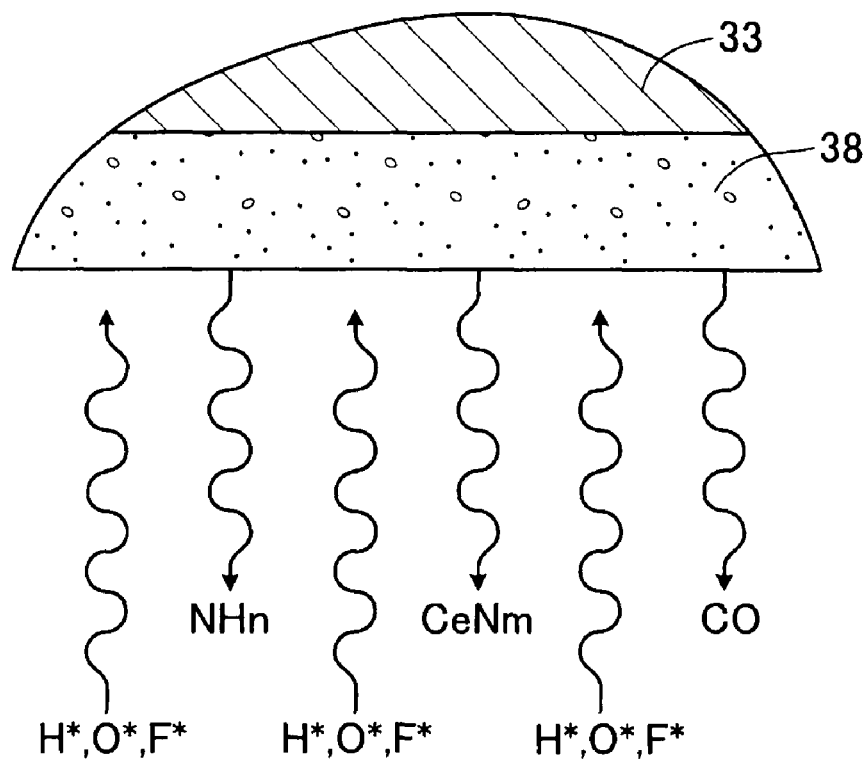
Figure 2B:
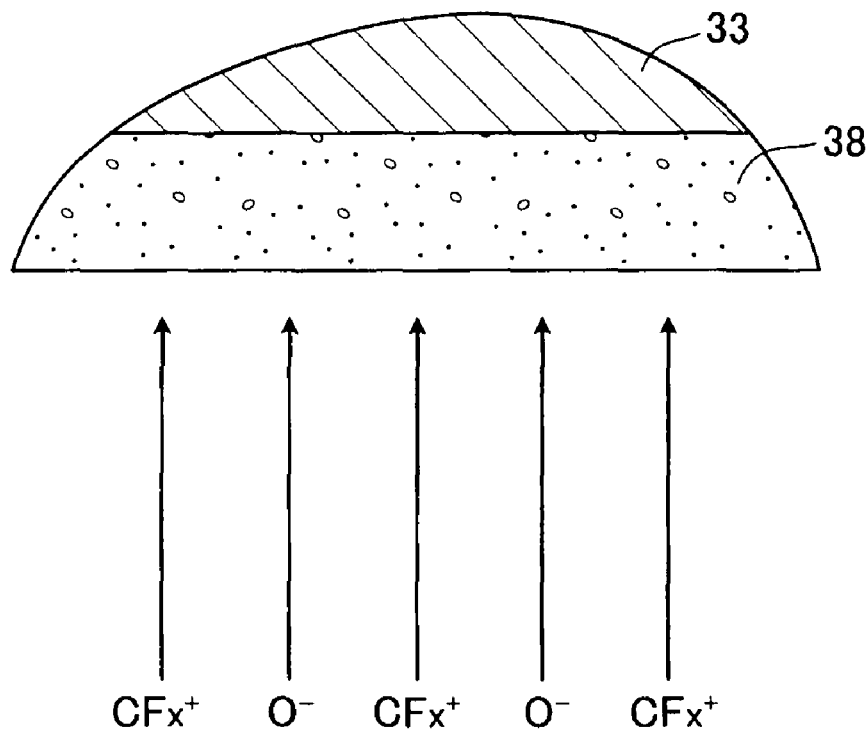

As described above, if the wafer W is subjected to the plasma etching processing using the plasma produced from the methane-containing process gas, CN-type reaction product is produced and becomes attached as CN-type deposit 38 to the ceiling electrode plate 33 of the showerhead 29 (see FIGS. 2A and 2B).

To cope with this, in the present embodiment, a cleaning gas (mixed gas) containing oxygen gas and $CHF_3$ gas (fluorinated compound gas containing hydrogen) is supplied to the reaction chamber 17 into which the wafer W has not yet been transferred but a dummy wafer has been transferred, and radio frequency voltage is applied to the interior of the reaction chamber 17, so that the cleaning gas is turned into plasma, more specifically, $CFx^+$ ions, $O^-$ ions, $H^*$ radicals, $F^*$ radicals, and $O^*$ radicals are produced (cleaning step).

The $H^*$ radicals have high reducing power, and hence when reaching the CN-type deposit 38, the $H^*$ radicals reduce the CN-type deposit 38 into methane, ammonia, and so on as expressed by the following equation, and the $F^*$ radicals, and $O^*$ radicals reduce the CN-type deposit 38 into $C_lN_m$, $NH_n$, CO, and so on (see FIG. 2A) (l to n are natural numbers). That is, the $H^*$ radicals and so on chemically separate the CN-type deposit 38. $C_vN_x + yH^* \rightarrow zNH_3\uparrow + wCH_4\uparrow$ (v to w are natural numbers)

Moreover, $CFx^+$ ions and $O^-$ ions sputter the CN-type deposit 38 and physically separate the CN-type deposit 38 (see FIG. 2B).

For the reasons stated above, the CN-type deposit 38 can be reliably removed from the ceiling electrode plate 33 using the plasma produced from the cleaning gas.

Next, a description will be given of the wafer lot processing as the substrate processing method according to the present embodiment.

Figure 3:
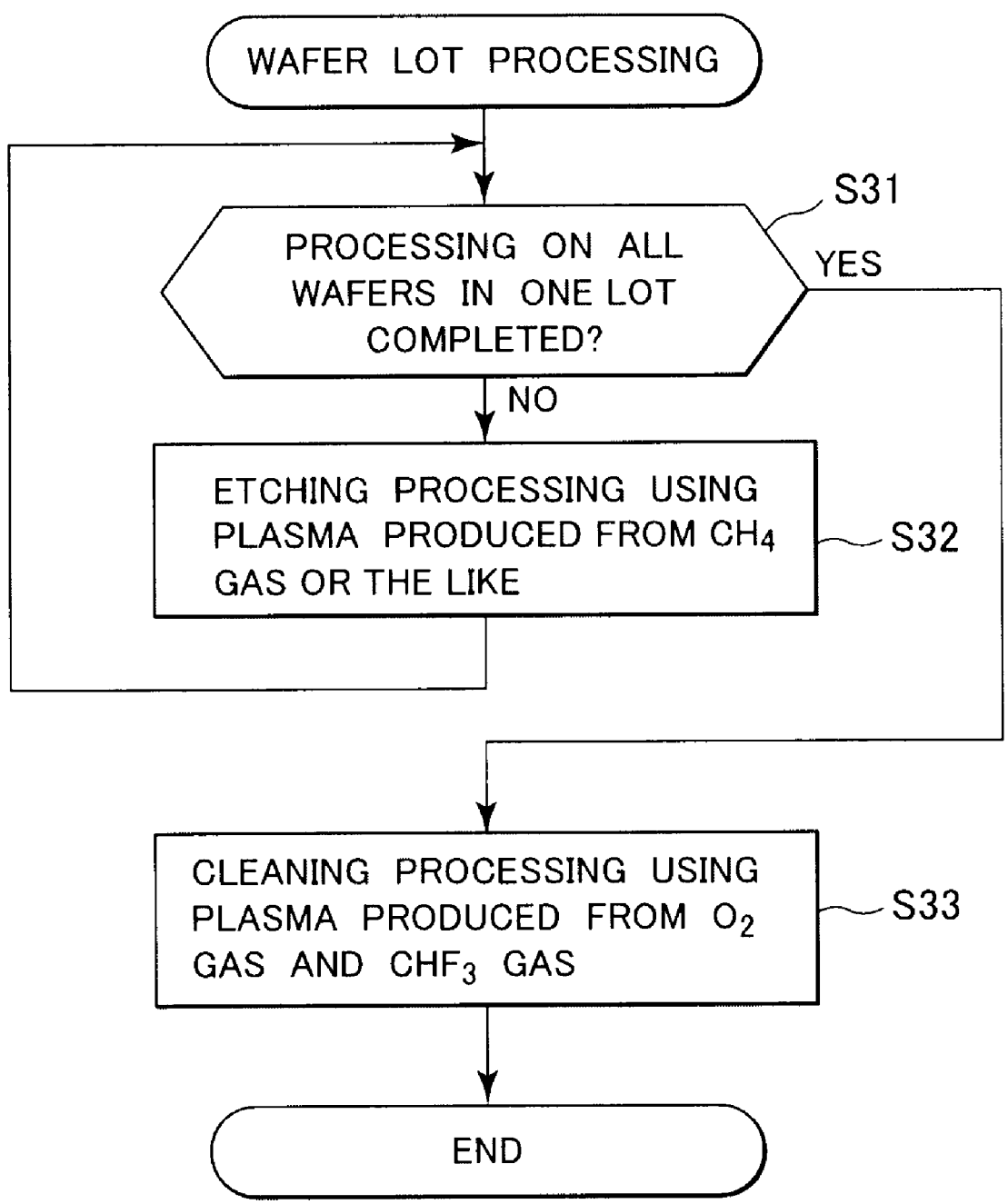
FIG. 3 is a flow chart of wafer lot processing as the substrate processing method according to the present embodiment.

FIG. 3 is a flow chart of the wafer lot processing. It should be noted that the processing in FIG. 3 is carried out by the CPU of the substrate processing apparatus 10.

First, in a step S31, it is determined whether or not the plasma etching processing on wafers W in one lot, for example, 25 wafers W has been completed. If the plasma etching processing on all the wafers W in one lot has not yet been completed (NO to step S31), the wafers W are transferred one by one into the reaction chamber 17 of the chamber 11, and each transferred wafer W is subjected to the plasma etching processing using plasma produced from a methane-containing process gas (step S32) (substrate processing step). If the step S32 is repeated, CN-type reaction product produced during the plasma etching processing on the wafers W is deposited as the CN-type deposit 38 on the ceiling electrode plate 33 of the showerhead 29.

If, as a result of the determination in the step S31, the plasma etching processing on all the wafers W in one lot has been completed (YES to step S31), a cleaning gas containing oxygen gas and $CHF_3$ gas is supplied into the reaction chamber 17 of the chamber 11 into which the wafer W has not yet been transferred but a dummy wafer has been transferred, and radio frequency voltage is applied to the interior of the reaction chamber 17, whereby $CFx^+$ ions, $O^-$ ions, $H^*$ radicals, $F^*$ radicals, and $O^*$ radicals are produced from the cleaning gas (step S33) (cleaning step). At this time, as described above, the CN-type deposit 38 is physically sputtered by the $CFx^+$ ions and the $O^-$ ions and reduced into methane, ammonia, and so on by the $H^*$ radicals.

Next, the step S33 is executed for a predetermined time period, followed by terminating the present process.

According to the processing in FIG. 3, because all the wafers W in one lot have been subjected to the plasma etching processing using the plasma produced from the methane-containing process gas, and then in the reaction chamber 17, the $CFx^+$ ions, $O^-$ ions, $H^*$ radicals, $F^*$ radicals, and $O^*$ radicals are produced from the cleaning gas containing oxygen gas and $CHF_3$ gas, the CN-type deposit 38 deposited on the ceiling electrode plate 33 of the showerhead 29 can be reliably removed through the plasma etching processing on all the wafers W in one lot. As a result, plasma can be produced in the reaction chamber 17 in a stable manner in the plasma etching processing on wafers W included in the next lot, and hence a decrease in the yield of semiconductor devices and so on manufactured from the wafers can be prevented.

According to the above described processing in FIG. 3, after the plasma etching processing on all the wafers W in one lot has been completed, plasma is produced from the cleaning gas to remove the CN-type deposit 38, but the timing in which the CN-type deposit 38 is removed is not limited to this, but for example, the CN-type deposit 38 may be removed after the plasma etching processing on all the wafers W in two lots or three lots has been completed. It is preferred that the timing in which the CN-type deposit 38 is removed is changed according to the deposition amount of the CN-type deposit 38.

Moreover, although in the above described processing in FIG. 3, the CN-type deposit 38 attached to the ceiling electrode plate 33 is removed, the CN-type deposit 38 to be removed is not limited to deposit attached to the ceiling electrode plate 33, but component parts existing in areas which the $CFx^+$ ions, $O^-$ ions, $H^*$ radicals, $F^*$ radicals, and $O^*$ radicals reach, that is, CN-type deposit 38 attached to component parts disposed in the reaction chamber 17 of the chamber 11 (hereinafter referred to as the "in-chamber component parts") is also removed.

It should be noted that the substrates subjected to the plasma etching processing according to the above described embodiment are semiconductor wafers W, but the substrates subjected to the plasma etching processing are not limited to being semiconductor wafers W, but rather may instead be any of various glass substrates used in LCDs (Liquid Crystal Displays), FPDs (Flat Panel Displays) or the like.

Next, a description will be given of examples of the present invention.

First, to ascertain the effect of the deposit removing method using plasma produced from a cleaning gas containing oxygen gas and $CHF_3$ gas (hereinafter referred to as the "deposit removing method according to the present invention"), the present inventors transferred a wafer W into the reaction chamber 17 of the chamber 11 in the substrate processing apparatus 10 in a state in which no CN-type deposit 38 was attached to the in-chamber component parts such as the ceiling electrode plate 33, and started the plasma etching processing using plasma. The present inventors measured the distribution of etch rates over the surface of the wafer W on this occasion, and showed the results using the solid line in the graph of FIG. 4 (measured points are indicated by "♦")

Then, while continuously producing plasma, the present inventors placed a dummy wafer in place of the wafer W in the reaction chamber 17 for five minutes. After five minutes, at a time point when the CN-type deposit 38 became attached to the in-chamber component parts and plasma was not stably produced in the reaction chamber 17, the present inventors transferred the dummy wafer out from the reaction chamber 17, and transferred the wafer W into the reaction chamber 17. Then, the present inventors started the plasma etching processing using the plasma. At this time as well, the present inventors measured the distribution of etch rates over the surface of the wafer W, and showed the results using the alternate long and short dash line in the graph of FIG. 4 (measured points are indicated by "■").

Then, the present inventors transferred the wafer W out from the reaction chamber 17, transferred the dummy wafer into the reaction chamber 17, and removed the CN-type deposit 38 using the deposit removing method according to the present invention. The processing conditions in the deposit removing method at this time were that the pressure was 800 mTorr, the supplied radio frequency electrical power of 100 MHz was 2000 W, the supplied radio frequency electrical power of 100 MHz was 0 W, the oxygen gas flow was 600 sccm, the $CHF_3$ gas flow rate was 600 sccm, and the magnetic flux density was 300 G. Then, the present inventors continued to remove the CN-type deposit 38 for three minutes. Then, the present inventors transferred the wafer W into the reaction chamber 17 and started the plasma etching processing using the plasma. At this time as well, the present inventors measured the distribution of etch rates over the surface of the wafer W, and showed the results using the broken line in the graph of FIG. 4 (measured points are indicated by "▲").

Figure 4:
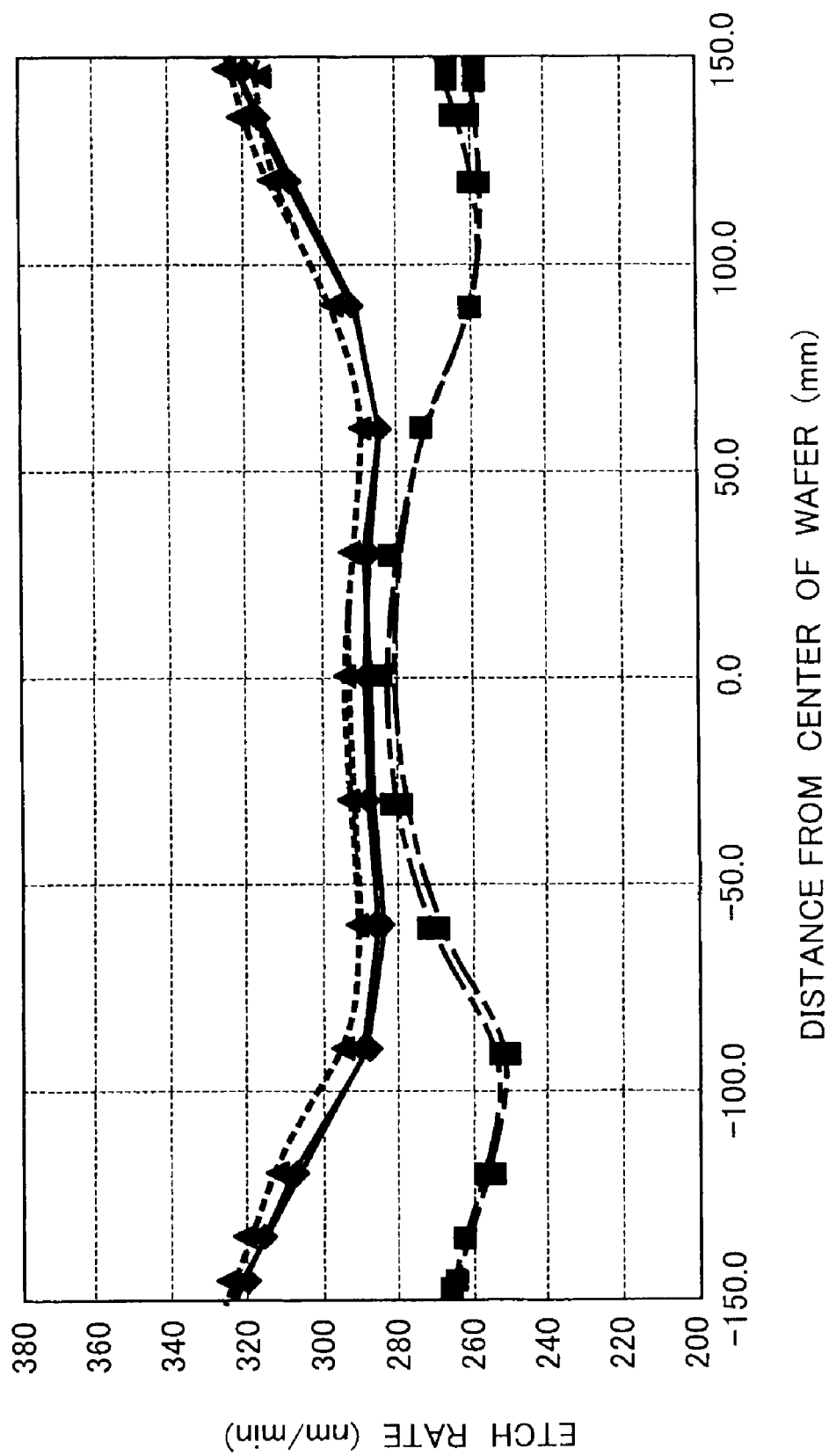
FIG. 4 is a view useful in explaining how the etch rate is restored using the substrate processing method according to the present embodiment in the substrate processing apparatus that has carried out plasma etching processing using a process gas containing methane gas.

From the graph of FIG. 4, it was found that the etch rate that has been decreased due to the deposition of the CN-type deposit 38 on the in-chamber component parts, for example, the ceiling electrode plate 33 of the showerhead 29 can be restored using the deposit removing method according to the present invention.

Then, the present inventors changed items of the processing conditions in the deposit removing method according to the present invention and ascertained the effects of the changed items.

Then, the present inventors set 10 kinds (examples 1 to 10) as shown in the following Table 1, executed the deposit removing method according to the present invention, calculated the restoration amounts of etch rates in the respective examples, and showed the calculation results in a graph of FIG. 5. The ordinate in the graph of FIG. 5 indicates differences in etch rate before and after the execution of the deposit removing method according to the present invention in the case that the deposit removing method according to the present invention was executed for one hour.

TABLE 1

| | Pressure (mTorr) | Radio frequency electrical power | | Flow rate of supplied cleaning gas | | Magnetic flux density (G) |
|---|---|---|---|---|---|---|
| | | 100 MHz (W) | 3.2 MHz (W) | $O_2$ (sccm) | $CHF_3$ (sccm) | |
| Example 1 | 800 | 2000 | 0 | 600 | 600 | 300 |
| Example 2 | 30 | 2000 | 0 | 1000 | 500 | 300 |
| Example 3 | 100 | 2000 | 0 | 750 | 750 | 300 |
| Example 4 | 800 | 2000 | 0 | 500 | 1000 | 300 |
| Example 5 | 800 | 1000 | 2000 | 1000 | 500 | 300 |
| Example 6 | 30 | 1000 | 2000 | 750 | 750 | 300 |
| Example 7 | 100 | 1000 | 2000 | 500 | 1000 | 300 |
| Example 8 | 100 | 300 | 4500 | 1000 | 500 | 300 |
| Example 9 | 800 | 300 | 4500 | 750 | 750 | 300 |
| Example 10 | 30 | 300 | 4500 | 500 | 1000 | 300 |

Figure 5:
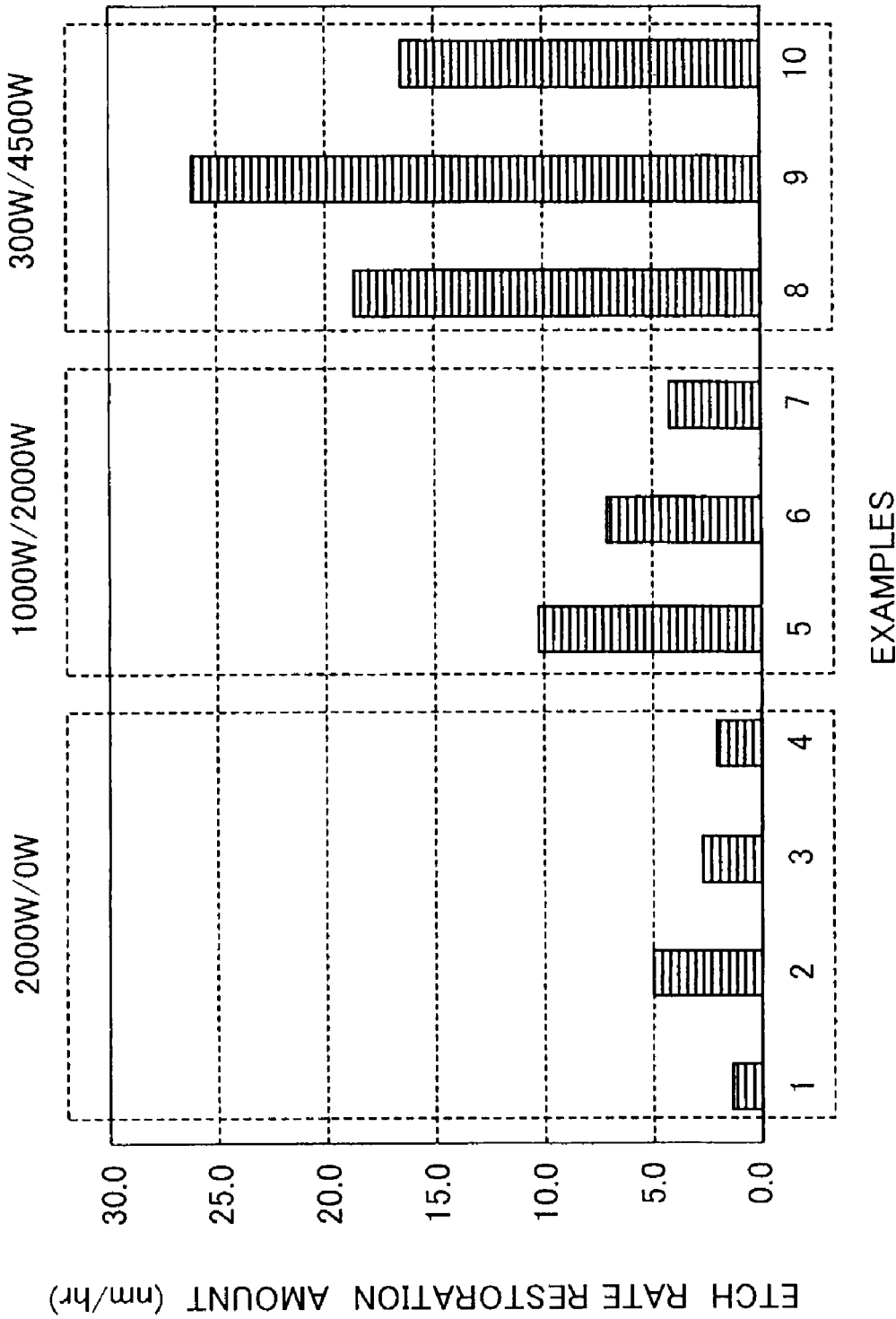
FIG. 5 is a graph showing the restoration amount of etch rate in the case that items of processing conditions have been changed in the deposit removing method according to the present embodiment.

As is clear from the graph of FIG. 5, it was found that the etch rate can be restored in all the examples. That is, if the pressure in the reaction chamber 17 is maintained at 30 mTorr or higher, the CN-type deposit 38 can be removed. It was also found that if the ratio of the $CHF_3$ gas to the oxygen gas in the cleaning gas is maintained inside a range of 0.5 to 2.0, the CN-type deposit 38 can be removed.

Also, from the graph of FIG. 5, it was found that the higher the supplied radio frequency electrical power of 3.2 MHz, the greater the restoration amount of etch rate, and the higher the pressure in the reaction chamber 17, the greater the restoration amount of etch rate.

Further, to ascertain the effects of the magnetic flux density in the reaction chamber 17, the present inventors executed the deposit removing method according to the present invention under the following two processing conditions (examples 11 and 12) with different magnetic flux densities.

Example 11 Pressure: 30 mTorr, Supplied radio frequency electrical power of 100 MHz: 2000 W, Supplied radio frequency electrical power of 3.2 MHz: 0 W, Oxygen gas flow rate: 300 sccm, $CHF_3$ gas flow rate of: 32 sccm, and Magnetic flux density: 300 G Example 12 Pressure: 800 mTorr, Supplied radio frequency electrical power of 100 MHz: 2000 W, Supplied radio frequency electrical power of 3.2 MHz: 0 W, Oxygen gas flow rate: 1200 sccm, $CHF_3$ gas flow rate of: 120 sccm, and Magnetic flux density: 56 G In both the examples 11 and 12, when the deposit removing method according to the present invention was executed for 30 seconds, it was ascertained that the CN-type deposit 38 was completely removed from the ceiling electrode plate 33. Thus, it was found that if the density of magnetic fluxes produced in the reaction chamber 17 is 56 G to 300 G, the CN-type deposit 38 can be removed.

Next, the present inventors ascertained how repetition of the wafer lot processing in FIG. 3 affected the etch rate.

Figure 6:
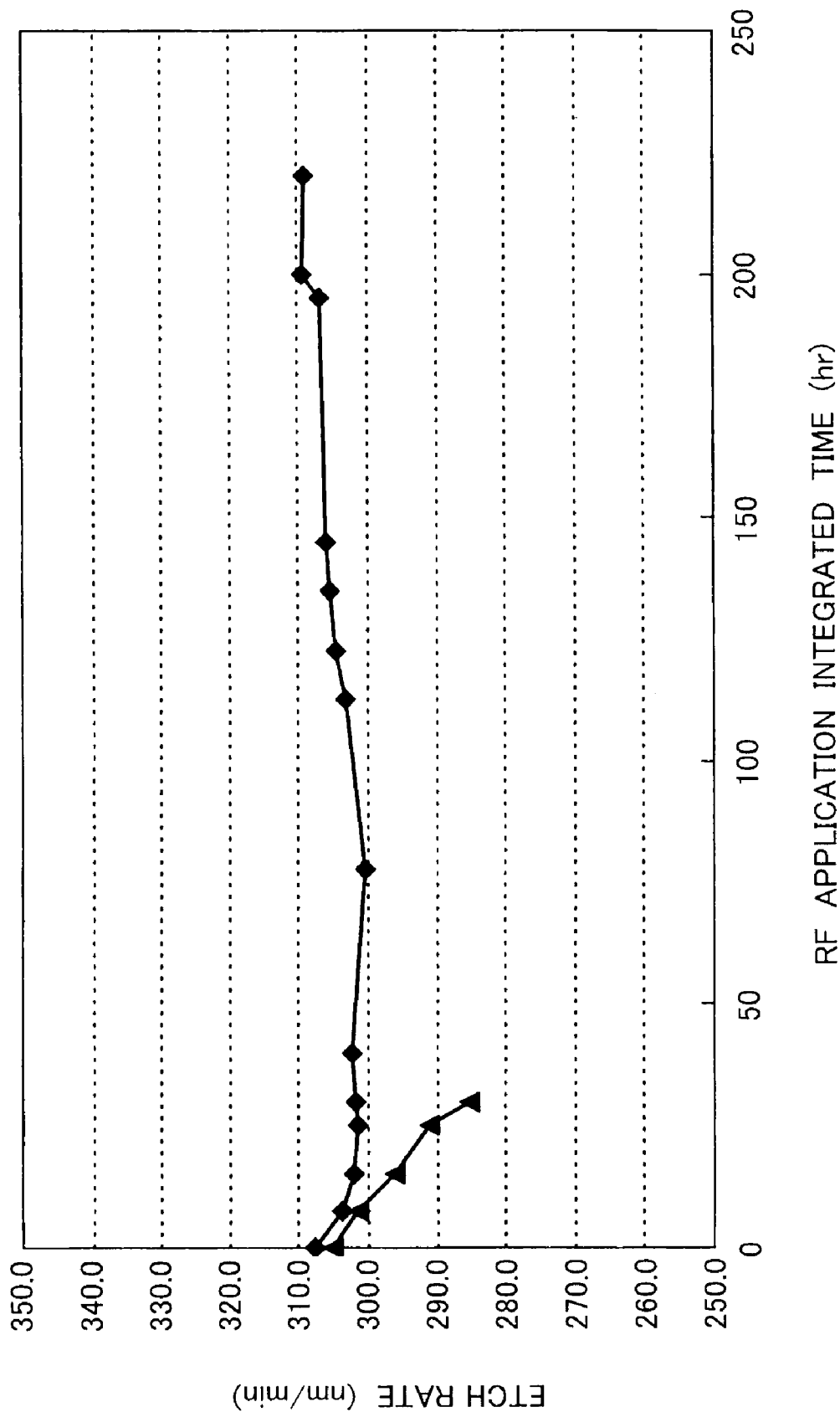
FIG. 6 is a graph showing changes in etch rate in the case that the wafer lot processing in FIG. 3 is repeatedly carried out.
Figure 7:
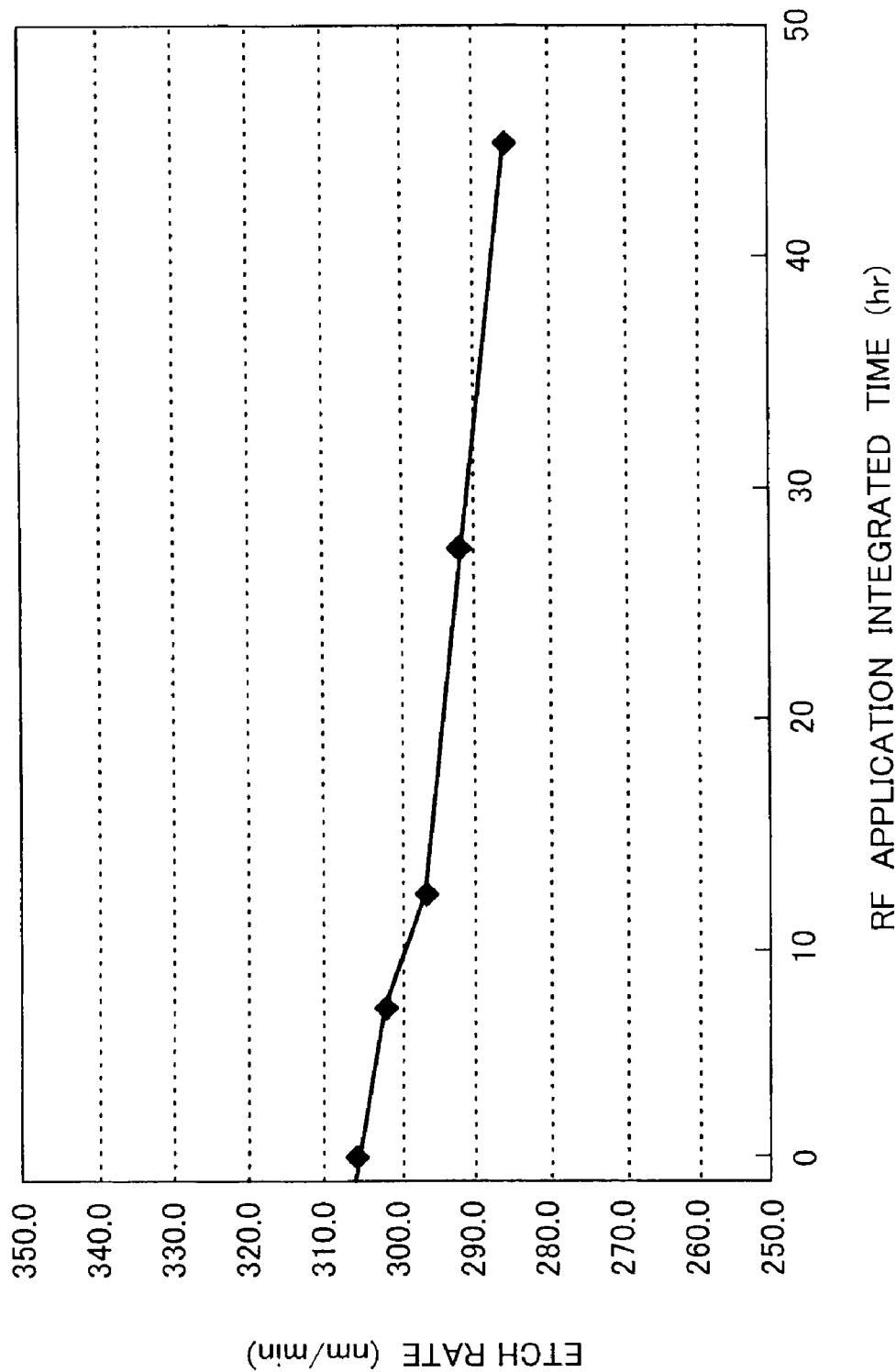
FIG. 7 is a graph showing changes in etch rate in the case that deposit has become attached to a showerhead.

First, in the case of continuously carrying out the plasma etching processing on wafers W in several lots without executing the deposit removing method according to the present invention, the present inventors measured etch rates, and showed the relationship between the time period of radio frequency voltage application and the etch rate using marks "▲" in a graph of FIG. 6.

Also, in the case of repeating the wafer lot processing in FIG. 3 on wafers W in several lots, that is, in the case of executing the deposit removing method according to the present invention each time the plasma etching processing was carried out on wafers W in one lot, the present inventors measured etch rates, and showed the relationship between the time period of radio frequency voltage application and the etch rate using marks "♦" in the graph of FIG. 6. The processing conditions in the deposit removing method at this time were that the pressure was 800 mTorr, the supplied radio frequency electrical power of 100 MHz was 300 W, the supplied radio frequency electrical power of 3.2 MHz was 4500 W, the oxygen gas flow rate was 1000 sccm, the $CHF_3$ gas flow rate was 500 sccm, and the magnetic flux density was 300 G.

As shown in the graph of FIG. 6, in the case that the deposit removing method according to the present invention was not executed, the etch rate decreased as the time period of radio frequency voltage application passed, but in the case that the deposit removing method according to the present invention was executed, the etch rate did not decrease even if the time period of radio frequency voltage application passed. It was thus found that if the deposit removing method according to the present invention is executed each time the plasma etching processing is carried out on wafers W in one lot, the CN-type deposit 38 attached to the in-chamber component parts can be reliably removed.

What is claimed is:

1. A deposit removing method comprising:
   a substrate processing step of carrying out plasma processing on a substrate using plasma produced from a process gas containing methane gas and nitrogen gas in a processing chamber in which an electrode to which radio frequency electrical power is supplied is disposed; and
   a cleaning step of producing plasma from a mixed gas consisting of oxygen gas and fluorinated compound gas containing hydrogen in the processing chamber,
   wherein a ratio of the fluorinated compound gas containing hydrogen to the oxygen gas in the mixed gas lies inside a range of 0.5 to 2.0.

2. A deposit removing method as claimed in claim 1, wherein the fluorinated compound gas containing hydrogen is $CHF_3$ gas.

3. A deposit removing method as claimed in claim 1, wherein a pressure in the processing chamber in said cleaning step is maintained at 30 mTorr or higher.

4. A substrate processing method comprising:
   a substrate processing step of continuously carrying out plasma processing on a plurality of substrates included in one lot using plasma produced from a process gas containing methane gas and nitrogen gas in a processing chamber in which an electrode to which radio frequency electrical power is supplied is disposed; and
   a cleaning step of, after continuously carrying out the plasma processing on the plurality of substrates included in the one lot, producing plasma from a mixed gas consisting of oxygen gas and fluorinated compound gas containing hydrogen in the processing chamber,
   wherein a ratio of the fluorinated compound gas containing hydrogen to the oxygen gas in the mixed gas lies inside a range of 0.5 to 2.0.

5. A deposit removing method as claimed in claim 1, wherein a density of magnetic fluxes produced in a reaction chamber lies inside a range of 56 G and 300 G.

6. A deposit removing method as claimed in claim 1, wherein deposit is reduced and sublimed by H* radicals.

7. A deposit removing method as claimed in claim 1, wherein the deposit to be removed in said cleaning step includes CN-type reaction product produced in said substrate processing step.

* * * * *